(12) United States Patent
Bai et al.

(10) Patent No.: US 8,377,317 B2
(45) Date of Patent: Feb. 19, 2013

(54) METHOD FOR MANUFACTURING PRINTED CIRCUIT BOARD WITH THICK TRACES

(75) Inventors: Yao-Wen Bai, Huaian (CN); Pan Tang, Huaian (CN); Xiao-Ping Li, Huaian (CN)

(73) Assignees: Hong Heng Sheng Electrical Technology (HuaiAn) Co., Ltd, Huaian (CN); Zhen Ding Technology Co., Ltd., Tayuan, Taoyuan (TW)

( * ) Notice: Subject to any disclaimer, the term of this patent is extended or adjusted under 35 U.S.C. 154(b) by 230 days.

(21) Appl. No.: 12/853,304

(22) Filed: Aug. 10, 2010

(65) Prior Publication Data

US 2011/0215069 A1 Sep. 8, 2011

(30) Foreign Application Priority Data

Mar. 8, 2010 (CN) .......................... 2010 1 0119553

(51) Int. Cl.
*H01B 13/00* (2006.01)
(52) U.S. Cl. ............... 216/13; 216/17; 216/18; 438/754
(58) Field of Classification Search .................. 216/13, 216/17, 18, 19, 99, 100, 77, 78; 438/612, 438/613, 614, 754
See application file for complete search history.

(56) References Cited

U.S. PATENT DOCUMENTS

| 6,544,584 | B1 * | 4/2003 | Arrington et al. ............. 430/314 |
| 2007/0209178 | A1 * | 9/2007 | Savic et al. .................. 29/25.41 |
| 2009/0056119 | A1 * | 3/2009 | Okabe et al. .................. 29/846 |

FOREIGN PATENT DOCUMENTS

| CN | 101351086 A | 1/2009 |
| CN | 201409254 Y | 2/2010 |

* cited by examiner

*Primary Examiner* — Lan Vinh
(74) *Attorney, Agent, or Firm* — Altis Law Group, Inc.

(57) ABSTRACT

A method for manufacturing printed circuit board includes steps below. A first electrically conductive layer including a first surface and a second surface at an opposite side thereof to the first surface is provided. A number of first traces directly formed on the second surface. A first insulating layer is formed on the second surface of the first electrically conductive layer and the surface of the first traces. The electrically conductive layer is etched to form a number of second traces, the second traces superpose the first traces, the first traces and the second traces constitute a circuit pattern.

14 Claims, 21 Drawing Sheets

METHOD FOR MANUFACTURING PRINTED CIRCUIT BOARD WITH THICK TRACES

BACKGROUND

1. Technical Field

The present disclosure generally relates to printed circuit boards (PCBs) and the manufacturing of, and particularly, relates to a method for manufacturing a printed circuit board with thick traces.

2. Description of Related Art

Printed circuit boards are widely used in most electronic devices for having electronic components mounted thereon and providing electrical transmission. With the development of electronic technology, the circuit patterns of the printed circuit boards need to bear higher current and diffuse the heat more quickly. Thus printed circuit boards with traces with a thickness of more than 105 micrometers are emerging.

The traces of the printed circuit boards are generally forming by etching a electrically conductive layer. In order to form thick traces, a thick electrically conductive layer should be applied. When the thick electrically conductive layer is etched, a larger undercut will be generated. That leads the width of the trace and the space between the neighbor traces hard to organize. Therefore, the electrical property of the printed circuit board is affected.

What is needed, therefore, is a method for manufacturing a printed circuit board with thick traces to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments will now be described in detail below and with reference to the drawings.

Referring to FIGS. 1-12, a method for manufacturing a PCB provided in a first embodiment includes the following steps.

Figure 1:
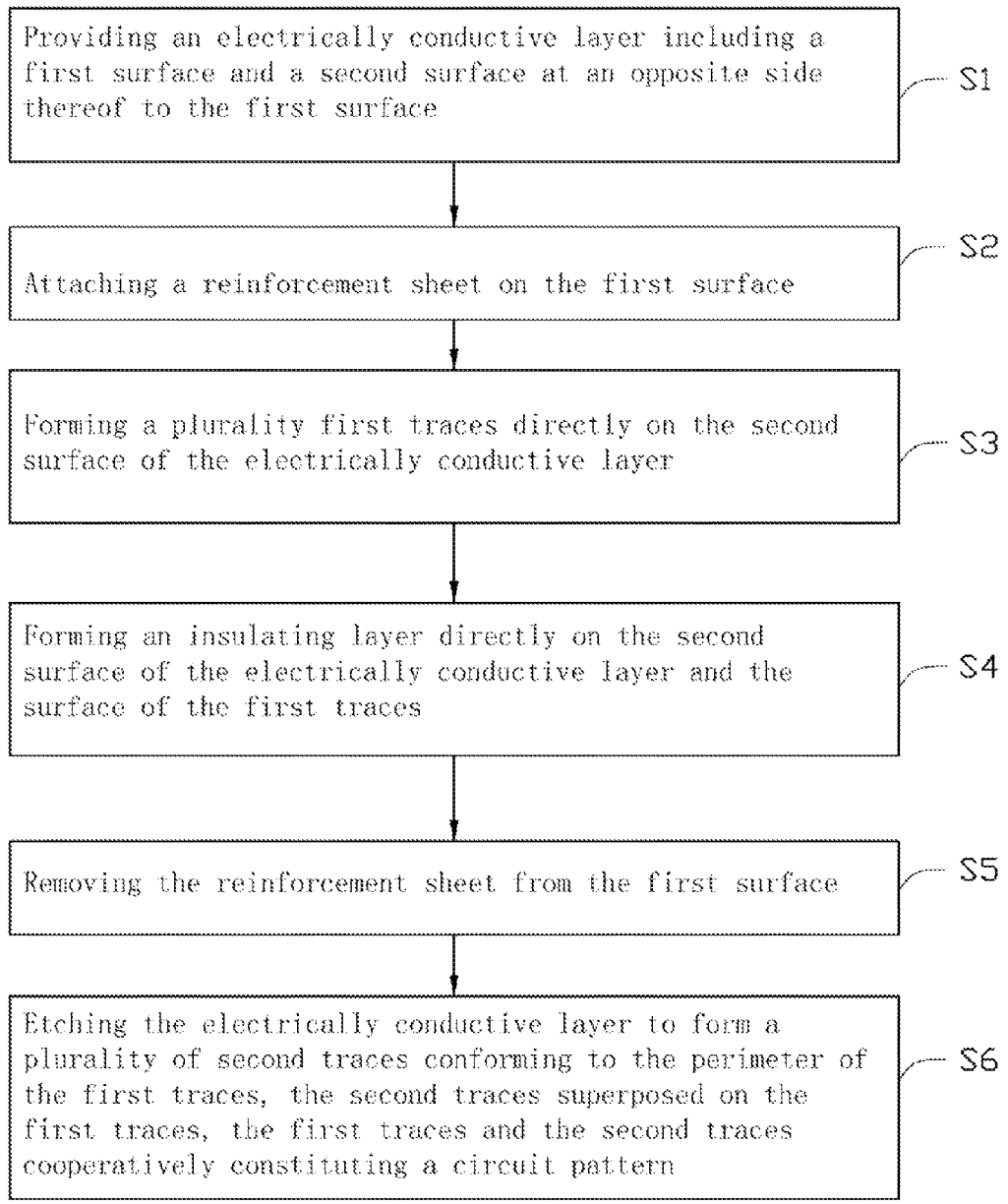
FIG. 1 is a flow chart showing a method for manufacturing a printed circuit board according to a first embodiment.
Figure 2:
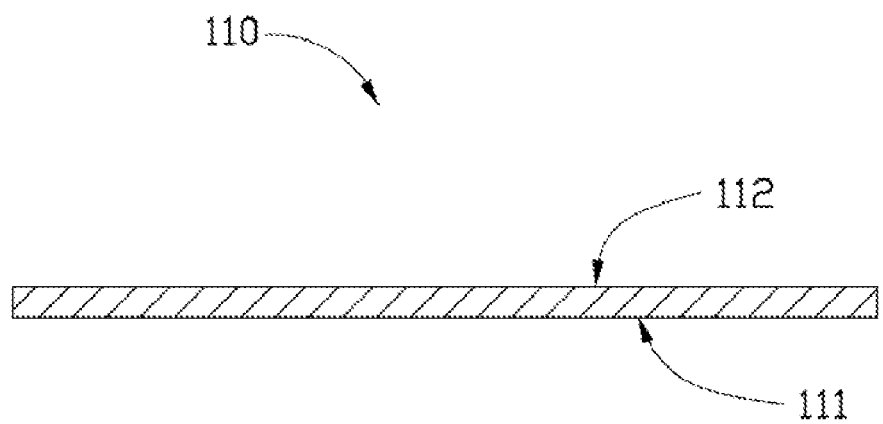
FIG. 2 is a cross sectional view of a electrically conductive layer in accordance with a first embodiment.

In step 1, referring to FIG. 2, an electrically conductive layer 110 is provided.

The electrically conductive layer 110 can be a foil, such as a copper foil, a silver foil, or a nickel foil. In one embodiment, the electrically conductive layer 110 is a copper foil. The electrically conductive layer 110 includes a first surface 111 and a second surface 112 at an opposite side to the first surface 111. The thickness of the electrically conductive layer 110 may be between about 30 micrometers to about 180 micrometers. In other words, a distance between the first surface 111 and the second surface 112 may be about 30 micrometers to about 180 micrometers.

Figure 3:
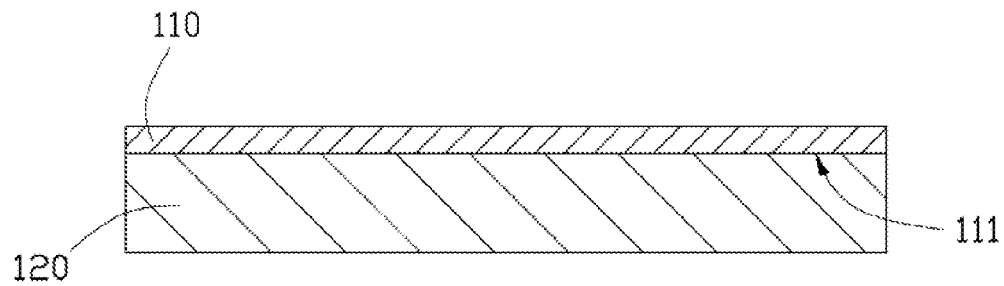
FIG. 3 is similar to FIG. 2, but showing a reinforcement sheet formed on the electrically conductive layer.
Figure 4:
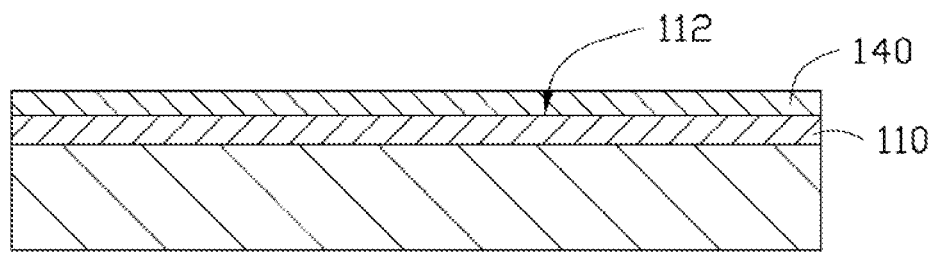
FIG. 4 is similar to FIG. 3, but showing a photoresist layer formed on the electrically conductive layer.
Figure 5:
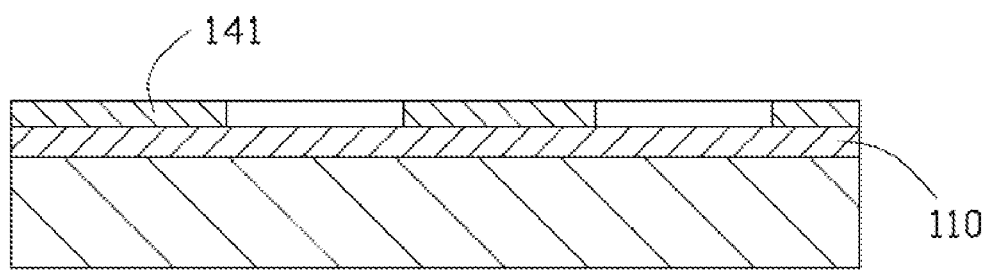
FIG. 5 is similar to FIG. 4, but showing a remaining photoresist layer formed on the electrically conductive layer.
Figure 6:
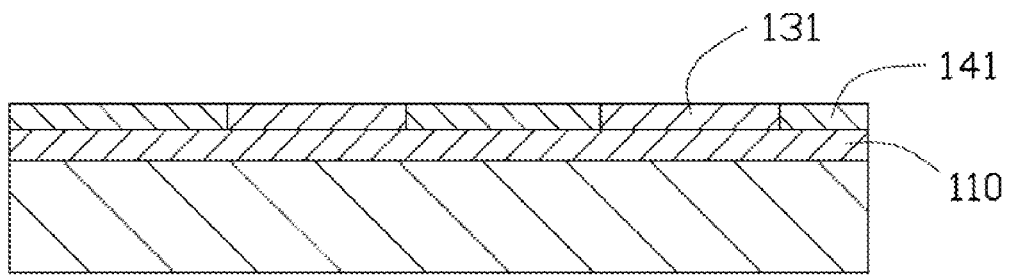
FIG. 6 is similar to FIG. 5, but showing a first trace formed on the electrically conductive layer.

In step 2, referring to FIG. 3, a reinforcement sheet 120 is attached on the first surface 111 of the electrically conductive layer 110.

The reinforcement sheet 120 is configured for reinforcement of the first electrically conductive layer 110. The reinforcement sheet 120 is made of rigid material such as plastic or inert metal. It can be understood that if the electrically conductive layer 110 has the enough mechanical strength and hardness, the step 2 may be omitted.

In step 3, referring to FIGS. 4 to 7, a plurality of first traces 131 are directly formed on the second surface 112 of the electrically conductive layer 110 using an electro-plating process.

First, a photoresist layer 140 is applied onto and over the entire second surface 112 of the electrically conductive layer 110, and a remaining photoresist layer 141 is formed using an exposing and developing process in the photoresist layer 140. A shape of the remaining photoresist layer 141 is complement with a shape of the first traces 131. The remaining photoresist layer 141 exposes those portions of the second surface 112 of the electrically conductive layer 110 that will eventually become the second traces 132. In one embodiment, the photoresist layer 140 is a dry photoresist film attached on the second surface 112 using a laminating process. In alternative embodiments, the photoresist layer 140 can be a liquid photoresist layer applied using a coating process. Then as the photoresist layer 140 is exposed and developed, portion of the photoresist layer 140 remains on the second surface 112 to form the remaining photoresist layer 141, portions of the second surface 112 corresponding to the first traces 131 are exposed from all of the gaps in the remaining photoresist layer 141.

Second, a plurality of first traces 131 are formed on the exposed portions of the second surface 112 using an electroplating process. In operation, before plating, the exposed portions of the second surface 112 are cleaned using lye and are micro etched to improve the adhesive force of metal layer in the plating process. In one embodiment, the first traces 131 are copper traces and the thickness can be controlled by the length of time of the electro-plating process. A sum of the thickness of the first traces 131 and the thickness of the electrically conductive layer 110 is equal to the thickness of the desired circuit pattern.

Figure 7:
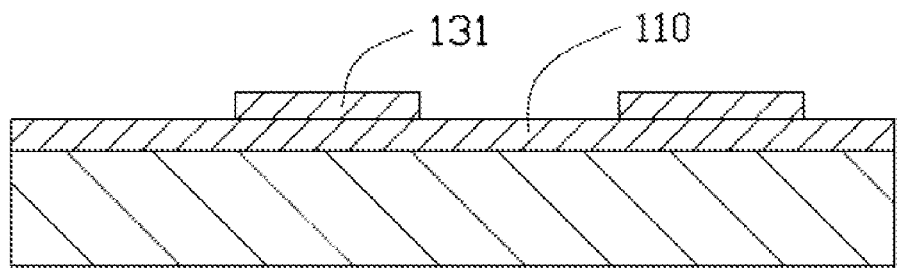
FIG. 7 is similar to FIG. 6, but showing the remaining photoresist layer removed from the electrically conductive layer.

Third, referring to FIG. 7, the remaining photoresist layer 141 is removed from the second surface 112 using a stripping process.

Figure 8:
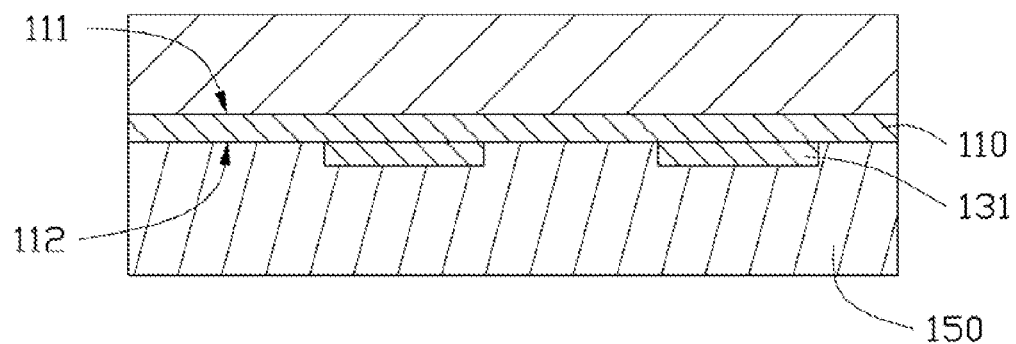
FIG. 8 is similar to FIG. 7, but showing an insulating layer formed on the electrically conductive layer and the first traces.

In step 4, referring to FIG. 8, an insulating layer 150 is formed on the surface of the first traces 131 and the second surface 112 of the electrically conductive layer 110, hence the first traces 131 are sandwiched between the first insulating layer 150 and the electrically conductive layer 110 and are embedded in the insulating layer 150. The first insulating layer 150 may be an insulation material plate attached to the surface of the first trace 131 and the second surface 112. Additionally, the first insulating layer 150 also may be a liquid insulating layer applied using a coating process.

Figure 9:
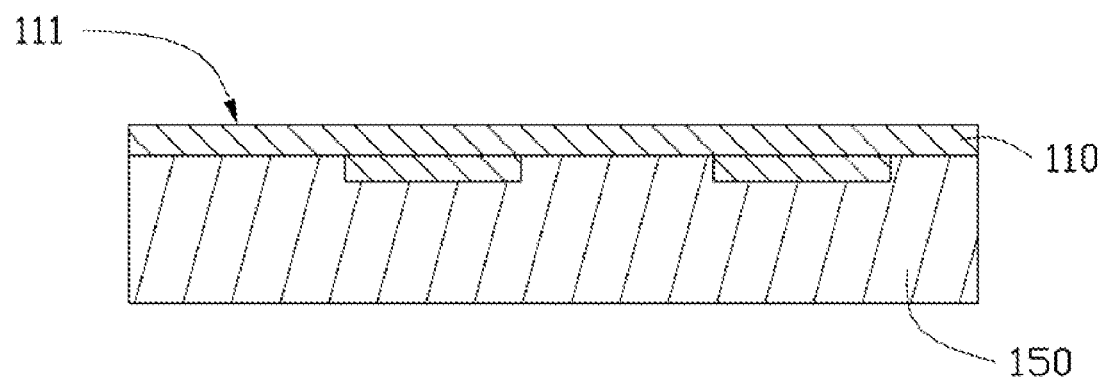
FIG. 9 is similar to FIG. 8, but showing the reinforcement sheet removed from the electrically conductive layer.

In step 5, referring to FIG. 9, the reinforcement sheet 120 is removed from the first surface 111 of the electrically conductive layer 110. If the reinforcement sheet 120 has not been attached on the first surface 111 in the step 2, the present step 5 is also omitted.

Figure 11:
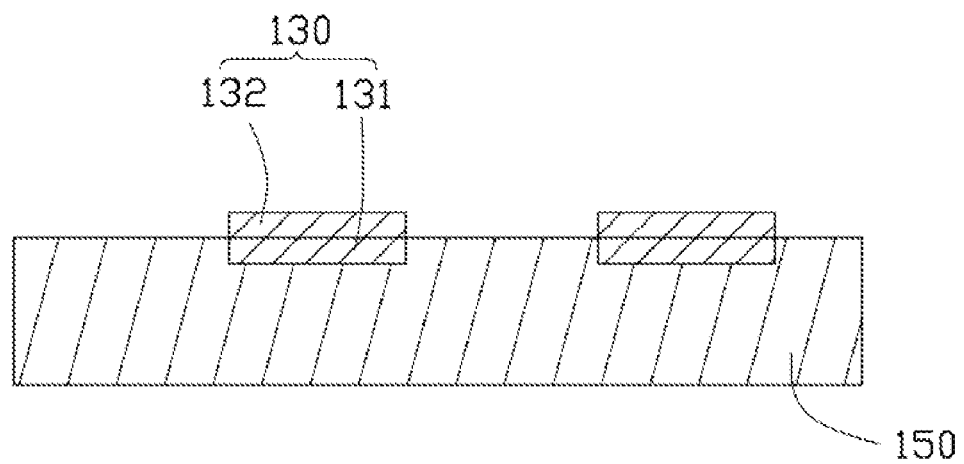
FIG. 11 is similar to FIG. 9, but showing the second traces superposing the first traces.
Figure 12:
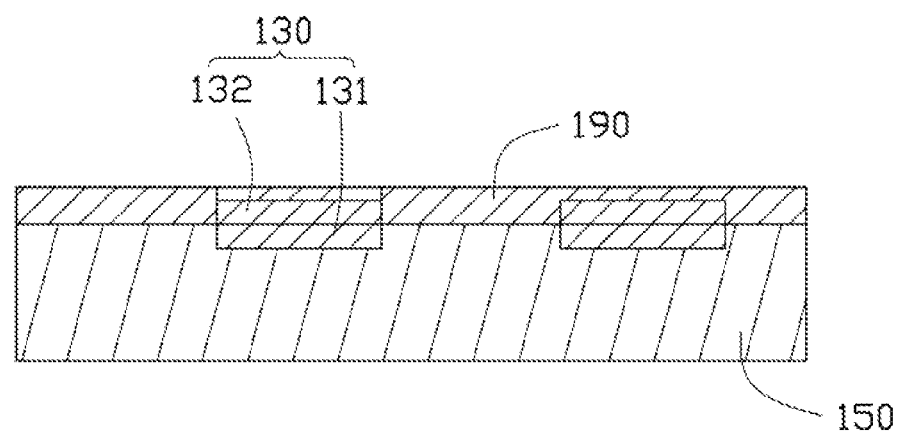
FIG. 12 is similar to FIG. 11, but showing a solder mask layer covering part of the circuit pattern.

In step 6, referring to FIG. 11, a number of second traces 132 are formed using a photolithography process and an etching process, the number of second traces 132 are placed upon the first traces 131 so that the perimeters of the second traces 132 and the first traces 131 coincide. The first traces 131 and the second traces 132 constitute a first circuit pattern 130, thus a single sided printed circuit board is obtained. Thereafter, referring to FIG. 12, a solder mask layer 190 may be formed on part of the surface of the first circuit pattern 130 to cover and protect the first circuit pattern 130.

Figure 10:
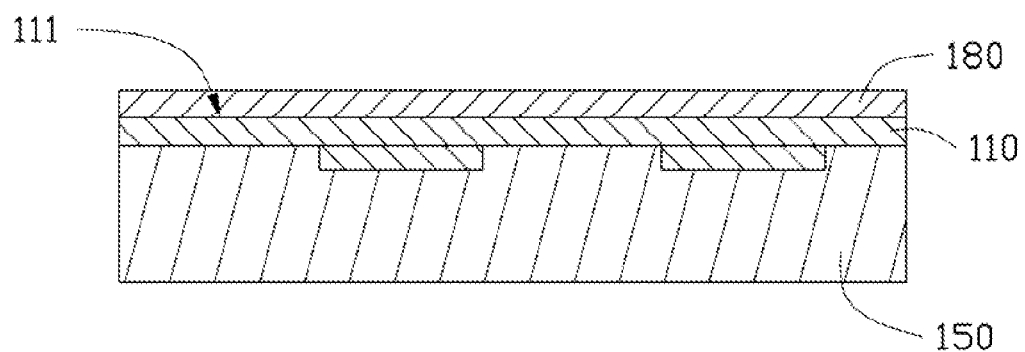
FIG. 10 is similar to FIG. 9, but showing a metal plating layer formed on the electrically conductive layer.

Furthermore, referring to FIG. 10, for purpose of increasing the thickness of the first circuit pattern 130, prior to forming the second traces 132, a metal plating layer 180 may be formed entirely on the first surface 111 of the electrically conductive layer 110.

Referring to FIGS. 13-21, a method for manufacturing a double sided printed circuit board is provided in a second embodiment. The method for manufacturing double sided printed circuit board includes the steps below.

Figure 13:
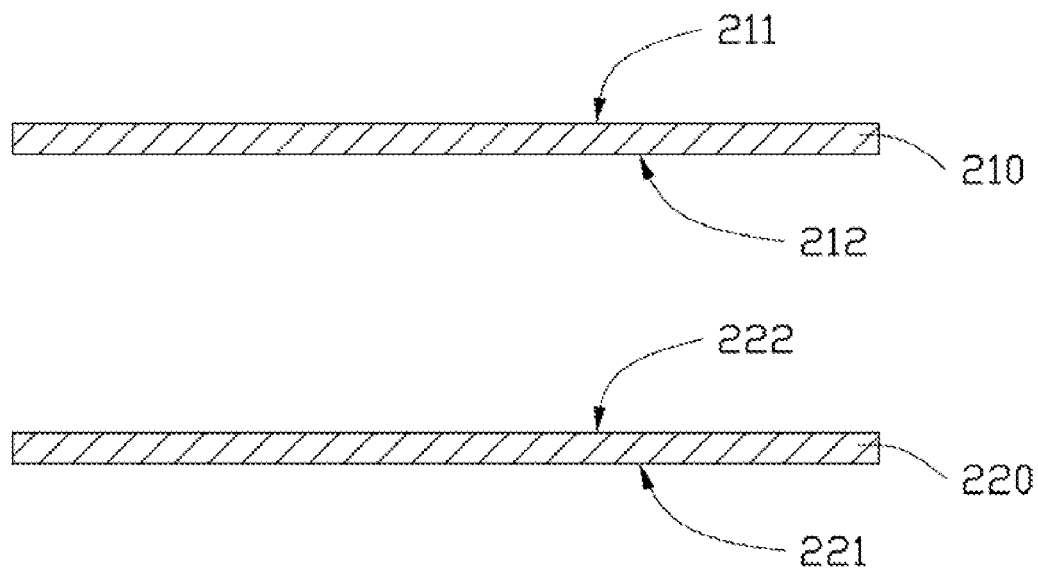
FIG. 13 is a cross sectional view of a first and a second electrically conductive layer in accordance with a second embodiment.

In step 1, referring to FIG. 13, a first electrically conductive layer 210 and a second electrically conductive layer 220 are provided. The thicknesses of first electrically conductive layer 210 and a second electrically conductive layer 220 are between about 30 micrometers to about 180 micrometers. The first electrically conductive layer 210 includes a first surface 211 and a second surface 212 at an opposite side to the first surface 211. The second electrically conductive layer 220 includes a third surface 221 and a fourth surface 222 at an opposite side to the third surface 221.

Figure 14:
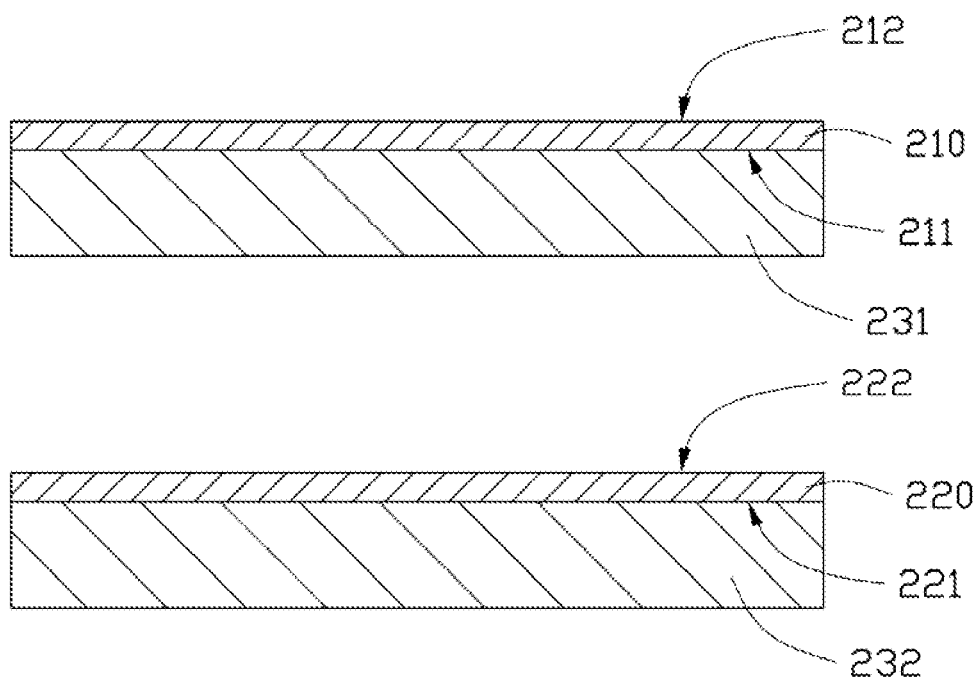
FIG. 14 is similar to FIG. 13, but showing the first reinforcement sheet and a second reinforcement sheet respectively formed on the first and second electrically conductive layer.

In step 2, referring to FIG. 14, a first reinforcement sheet 231 is attached on the first surface 211 of the first electrically conductive layer 210, and a second reinforcement sheet 232 is attached on the third surface 221 of the second electrically conductive layer 220.

Figure 15:
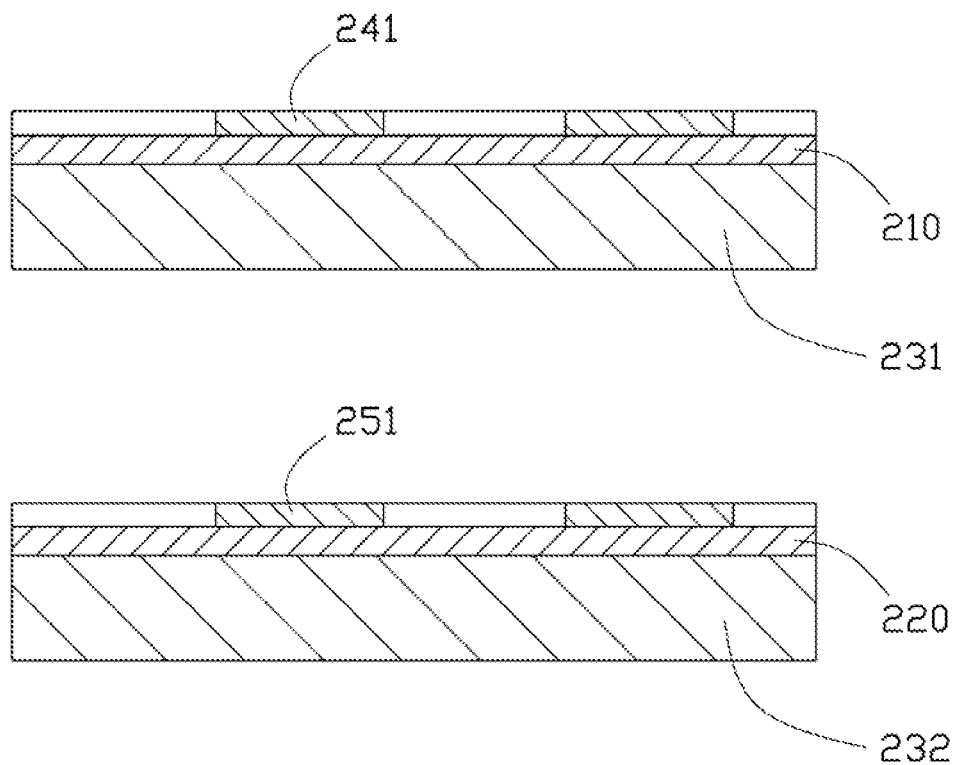
FIG. 15 is similar to FIG. 14, but showing the first traces and second traces respectively formed on the first and second electrically conductive layer.
Figure 16:
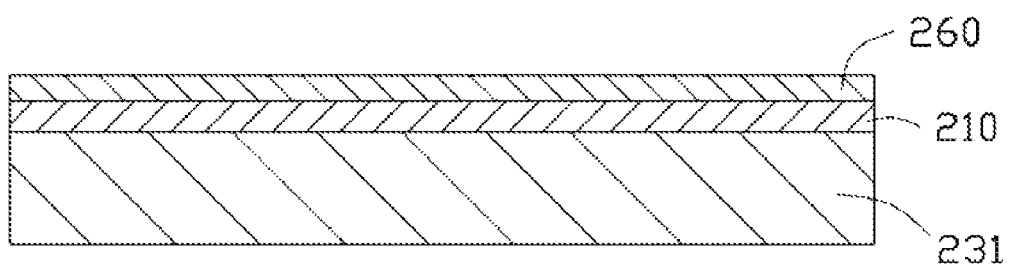
FIGS. 16 and 17 are similar to FIG. 15, but showing the steps of the first traces formed on the first electrically conductive layer.
Figure 17:
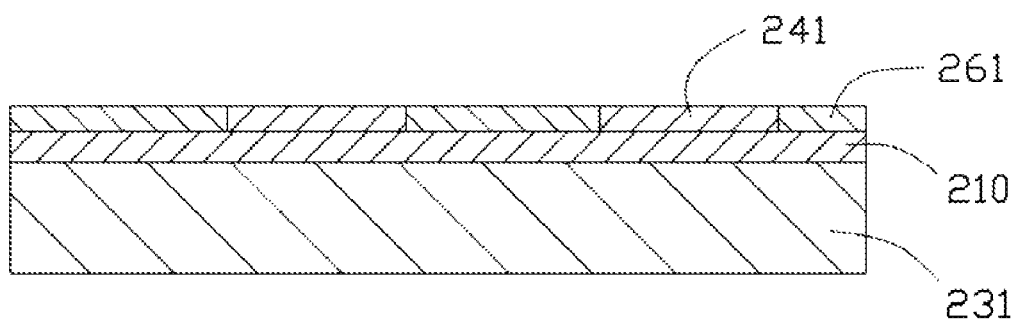

In step 3, referring to FIGS. 15, 16 and 17, a plurality of first traces 241 are directly formed on the first electrically conductive layer 210, and a plurality of second traces 251 are directly formed on the second electrically conductive layer 220.

Forming the first traces 241 and the second traces 251 uses the same processes as the forming the first trace 131 in the first embodiment. In detail, a first photoresist layer 260 is applied onto and over the entire second surface 212, a first remaining photoresist layer 261 is formed in the first photoresist layer 260 using an exposing and a developing process. A shape of the first remaining photoresist layer 261 is substantially the same shape as the first traces 241. The first remaining photoresist layer 261 exposes those portions of the second surface 212 of the first electrically conductive layer 210 that will eventually become the third traces 132. A number of first traces 241 are directly formed on the exposed portions of the second surface 212 using a plating process. Then, the first remaining photoresist layer 261 is removed from the second surface 212 using a stripping process. The second traces 251 are formed using the same process as the first traces 241.

Figure 18:
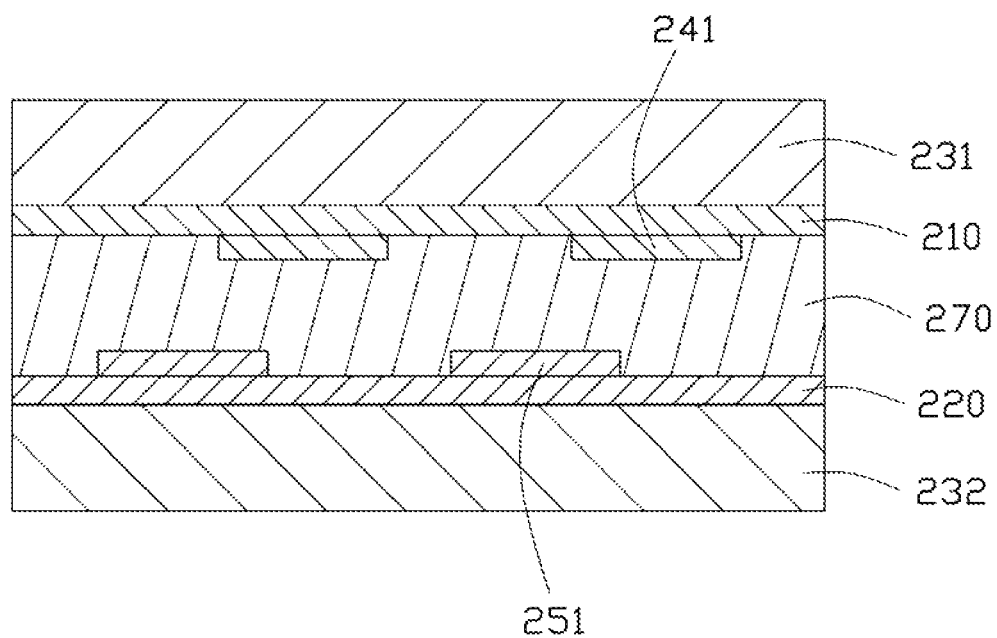
FIG. 18 is similar to FIG. 15, but showing the first electrically conductive layer, an insulating layer and the second electrically conductive layer stacked and laminated.

In step 4, referring to FIG. 18, the first electrically conductive layer 210, and the second electrically conductive layer 220 are attached to opposite sides of an insulating layer 270. The second surface 212 of the first electrically conductive layer 210 and the fourth surface 222 of the second electrically conductive layer 220 faces the insulating layer 270. In other words, the insulating layer 270 is sandwiched between the second surface 212 and the fourth surface 222, the first electrically conductive layer 210, the insulating layer 270, and the second electrically conductive layer 220 are laminated, the first traces 241 and the second traces 251 are embedded in the insulating layer 270.

Figure 19:
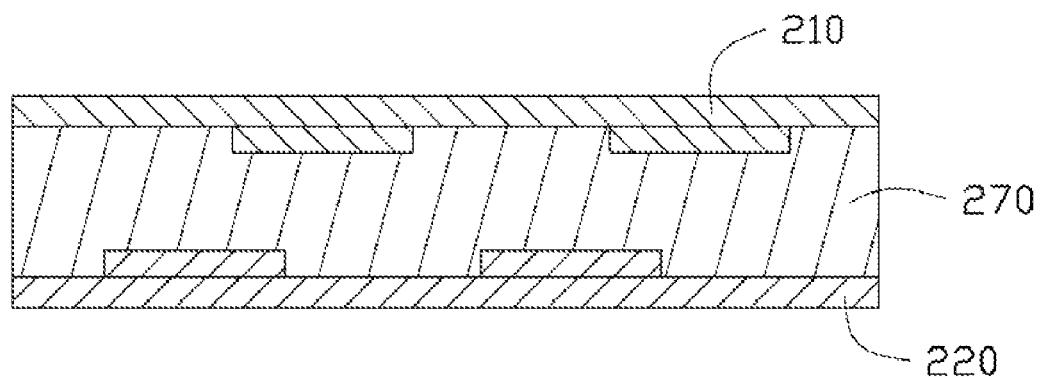
FIG. 19 is similar to FIG. 18, but showing the first reinforcement sheet and the second reinforcement sheet removed.

In step 5, referring to FIG. 19, the first reinforcement sheet 231 is removed from the first surface 211 of the first electrically conductive layer 210, and the second reinforcement sheet 232 is removed from the third surface 221 of the second electrically conductive layer 220.

Figure 21:
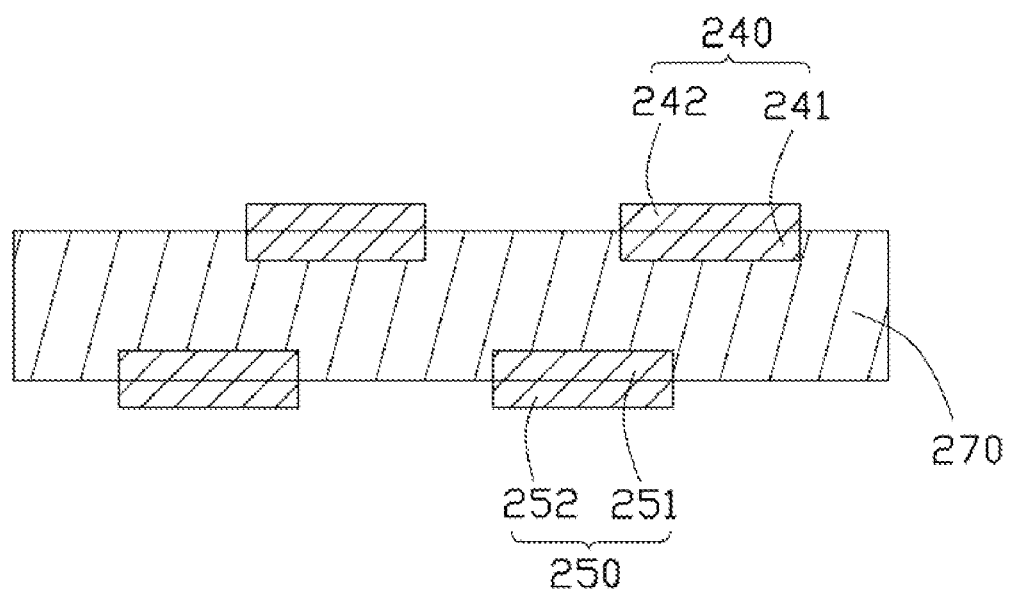
FIG. 21 is similar to FIG. 20, but showing third traces superposing the first traces and the fourth traces superposing the second traces.

In step 6, referring to FIG. 21, a number of third traces 242 are formed using a traditional photolithography process and an etching process, the third traces 242 are placed on the first traces 241 so that the perimeters of the third traces 242 and the first traces 241 coincide. The first traces 241 and the third traces 242 constitute a first circuit pattern 240. A plurality of fourth traces 252 are formed using a traditional photolithography process and an etching process, the fourth traces 252 are placed on the second traces 251 so that the perimeters of the second traces 251 and the fourth traces 252 constitute a second circuit pattern 250, thus a double sided printed circuit board is obtained.

Figure 20:
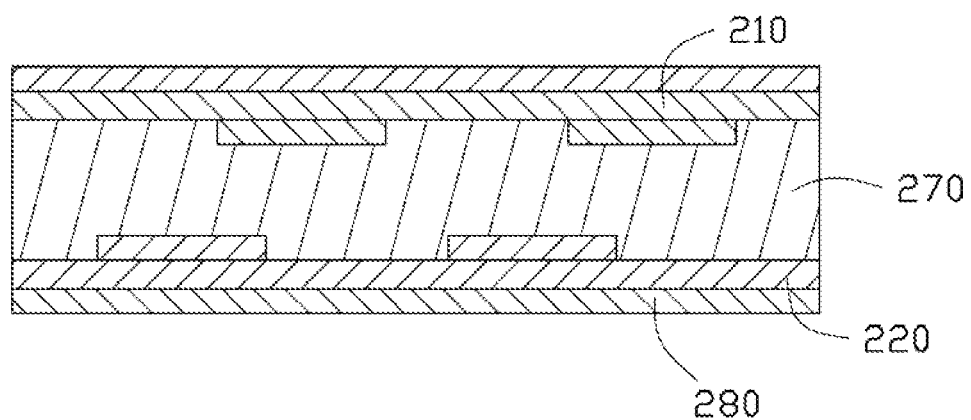
FIG. 20 is similar to FIG. 19, but showing a metal plating layer respectively formed on the first electrically conductive layer and the second electrically conductive layer.

Referring to FIG. 20, prior to forming the third traces 242 and the fourth traces 252, in order to increase the thickness of the first electrically conductive layer 210 and the second electrical layer 220. A metal plating layer 280 can be formed respectively on the entire first surface 211 of the first electrically conductive layer 210 and the entire third surface 221 of the second electrically conductive layer 220.

The method of present embodiment may further include stacking at least two single sided printed circuit boards or double sided printed circuit board and an insulating layer therebetween, thus a multi-layer printed circuit board is obtained.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

The invention claimed is:

1. A method for manufacturing printed circuit board, comprising:
    providing an electrically conductive layer including a first surface and a second surface at an opposite side thereof to the first surface;
    forming a plurality of first traces directly on the second surface of the electrically conductive layer;
    attaching or printing an insulating layer directly on the second surface of the electrically conductive layer and the surface of the first traces after forming the plurality of first traces directly on the second surface of the electrically conductive layer; and
    etching the electrically conductive layer to form a plurality of second traces conforming to the perimeter of the first traces after attaching or printing the insulating layer on the second surface of the electrically conductive layer and the surface of the first traces, the second traces superposed on the first traces, the first traces and the second traces cooperatively constituting a circuit pattern.

2. The method as claimed in claim 1, further comprising a step of attaching a reinforcement sheet on the first surface of the electrically conductive layer prior to forming the first traces and a step of removing the reinforcement sheet prior to etching the electrically conductive layer to form the second traces.

3. The method as claimed in claim 1, wherein the first traces are formed using an electro-plating process.

4. The method as claimed in claim 2, wherein the first traces are formed by the steps comprising:
    forming a photoresist layer on the second surface, and exposing and developing the photoresist layer to form a remaining patterned photoresist layer, with portions of the second surface of the electrically conductive layer being exposed; and
    forming the first traces directly on the exposed portions of the second surface using a plating process.

5. The method as claimed in claim 3, further comprising a step of removing the remaining patterned photoresist layer from the second surface after the first traces are formed.

6. The method as claimed in claim 1, further comprising a step of forming a plating metal layer on the first surface of the electrically conductive layer prior to forming the first traces.

7. The method as claimed in claim 1, wherein the electrically conductive layer is copper foil.

8. The method as claimed in claim 1, further comprising a step of forming a solder mask layer on the circuit pattern to cover and protect the circuit pattern.

9. The method as claimed in claim 1, wherein a thickness of the electrically conductive layer is in a range from 30 to 180 micrometers.

10. A method for manufacturing a printed circuit board comprising:
    providing a first electrically conductive layer comprising a first surface and a second surface at an opposite side thereof to the first surface, and a second electrically layer having a third surface and a fourth surface at an opposite side thereof to the third surface;
    forming a plurality of first traces directly on the second surface and a plurality of second traces directly on the fourth surface;
    attaching the first electrically conductive layer and the second electrically conductive layer to opposite sides of an insulating layer after forming a plurality of first traces directly on the second surface and a plurality of second traces directly on the fourth surface, the second surface and fourth surface facing the insulating layer, the first traces and the second traces embedded in the insulating layer after plating the plurality of the first traces and the plurality second traces;
    etching the first electrically conductive layer to form a plurality of third traces; and
    etching the second electrically conductive layer to form a plurality of fourth traces after attaching the first electrically conductive layer and the second electrically conductive layer to opposite sides of an insulating layer, the third traces superposed on the first traces, the first traces and the third traces cooperatively constituting a first circuit pattern, the fourth traces superposed on the second traces, the second traces and the fourth traces cooperatively constituting a second circuit pattern.

11. The method as claimed in claim 10, further comprising a step of attaching a first reinforcement sheet on the first surface and a second reinforcement sheet on the third surface prior to forming the first traces directly on the second surface and the second traces directly on the fourth surface, and steps of removing the first reinforcement sheet from the first surface and removing the second reinforcement sheet from the third surface.

12. The method as claimed in claim 10, wherein the first traces and the second traces are formed using an electro-plating process.

13. The method as claimed in claim 10, wherein the first traces and the second traces are formed by the steps comprising:
    forming a first photoresist layer on the second surface, and exposing and developing the first phororesist layer to form a first remaining patterned photoresist with portions of the second surface of the first electrically conductive layer being exposed, forming a second photoresist layer on the fourth surface of the second electrically conductive layer, and exposing and developing the second phororesist layer to form a second remaining patterned photoresist layer with portions of the fourth surface of the second electrically conductive layer being exposed; and
    forming the first traces directly on the expose portions of the second surface and the second traces directly on the exposed portions of the fourth surface using a plating process.

14. The method as claimed in claim 10, further comprising forming a metal plating layer on the first surface prior to forming the third traces, and forming another metal plating layer on the third surface prior to forming the fourth traces.

* * * * *